SIGNIFICANT IMPURITY SOURCES FOR SOLID STATE DIFFUSION
Filed Oct. 11, 1966
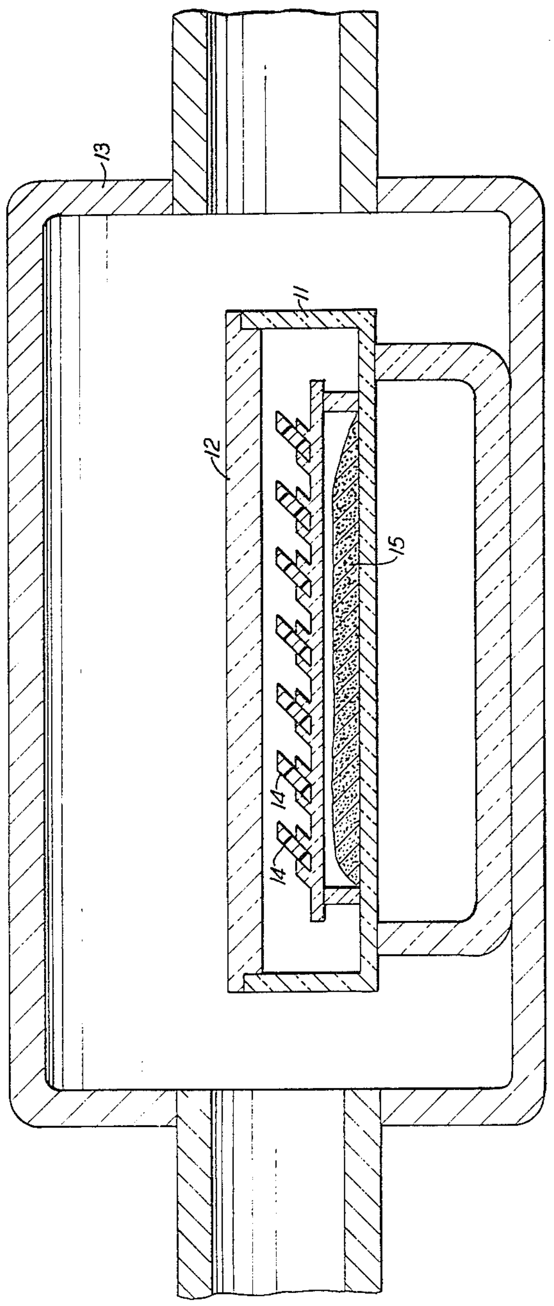
INVENTORS W. E. BEADLE
K. E. BENSON
BY H. W. Lockhart
ATTORNEY United States Patent Office 3,473,980

Patented Oct. 21, 1969

3,473,980

SIGNIFICANT IMPURITY SOURCES FOR SOLID STATE DIFFUSION

William E. Beadle, Sinking Spring, and Kenneth E. Benson, Allentown, Pa., assignors to Bell Telephone Laboratories, Incorporated, Murray Hill, and Berkeley Heights, N.J., a corporation of New York Filed Oct. 11, 1966, Ser. No. 585,979
Int. Cl. H01l 7/44; C22c 31/00
U.S. Cl. 148—189 1 Claim

ABSTRACT OF THE DISCLOSURE

A highly controllable source material for producing shallow phosphorus diffused zones in silicon semiconductor bodies comprises a ternary solid solution of 58% germanium, 6% silicon and 36% phosphorus by weight.

This invention relates to semiconductor devices and more particularly to the fabrication of such devices using solid state diffusion methods for introducing significant impurities.

Although the art of solid state diffusion for fabricating semiconductor devices is relatively well developed, difficulties are still encountered in making very shallow uniformly diffused zones in semiconductor bodies. In particular, very thin, high surface concentration, diffused zones are desirable in transistors for high frequency applications. The fabrication of such zones in general requires close control of the vapor pressure of the diffusant and particularly, requires a low vapor pressure.

It is, of course, desirable that the impurity source for such gaseous diffusion be pure, that it be easily handled, and should not deplete so rapidly as to require frequent replenishment. Another desirable feature of an impurity source material is that the impurity vapor pressure be controllable. Thus, by changes in composition the same vapor pressure is exhibited at different temperatures or conversely, different vapor pressures may be observed at a given temperature.

The use of diluted sources for impurity diffusants as suggested in Patent 2,868,678 to W. Shockley has been a common practice in this art to affect vapor pressure. In particular, for example, in accordance with the Shockley patent a significant impurity such as phosphorus is alloyed with a quantity of the same kind of semiconductor material which is being diffused. If the diffusion treatment is of germanium semiconductor material, then a germanium-phosphorus alloy mixture may be used as a more controllable source.

However, binary alloys both in solid and liquid form still do not meet the needs of the highly precise diffusion treatment required for transistors in the microwave range. Such alloys have been found to exhibit relatively high vapor pressure and to deplete rather rapidly, requiring frequent replenishment. In accordance with this invention ternary solutions including both of the elemental semiconductors, germanium and silicon, combined with the diffusant impurity, are provided in varying proportions. Such solutions have been found to provide impurity sources suitable for the fabrication of very thin, high surface concentration diffused zones in semiconductor devices. In one particular embodiment a phosphorus diffusant source comprises a solid solution comprising by weight, 36 percent phosphorus, 58 percent germanium and 6 percent silicon. This solution is designed for the diffusion treatment of silicon and germanium semiconductor material at typical diffusion temperatures and will provide a highly uniform source of gaseous phosphorus for diffusion treatments for the order of several hundred hours.

The invention and its particular features and advantages will be more clearly understood from the following detailed description taken in connection with a drawing in which apparatus is depected for practicing the method in accordance with this invention.

Referring to the drawing, there is shown a diffusion apparatus which may be characterized as a quasi-closed box arrangement. A quartz container 11 is mounted in a suitable furnace enclosure 13 capable of maintaining temperatures in the diffusion heat treatment ranges which may extend to just below the melting temperatures of the particular semiconductor materials. Typically, for germanium the upper limit is about 900 degrees and for silicon about 1400 degrees centigrade. Within the quartz container, which has a fairly tightly fitted lid 12, there is mounted an array of germanium semiconductor slices 14 which have been prepared by oxide masking for the diffusion heat treatment of an N type impurity to produce the base zones of high frequency transistors. As is well known in the art each slice is suitably masked on one face so as to yield a plurality, as many as several hundred, of transistors.

In the bottom of the quartz container 11 is a small quantity of the source material 15 of the diffusant impurity, in this case phosphorus, in the form of a crystalline powder. Advantageously, the furnace enclosure 13 is subjected to a flow of hydrogen gas to preclude the introduction of unwanted impurities from the atmosphere. In accordance with methods well known in the art the furnace is raised to a temperature suitable for causing the solid state diffusion from phosphorus evolved from the source material into the unmasked germanium semiconductor material. Typically, for germanium and for the particular devices being produced a temperature of about 700 degrees is used. A quantity of about 1.6 grams of the powdered source material 15 is placed in the bottom of the boat and after a period of one hour at a temperature of 720 degrees centigrade the semiconductor material is removed and the phosphorus has been diffused to a depth of 0.44 micron.

The source material in this specific embodiment, containing 36 percent phosphorus, 58 percent germanium and 6 percent silicon, by weight, is prepared by synthesizing germanium, silicon and phosphorus in an evacuated quartz capsule. Synthesis is accomplished by heating the mixture of the three elements in the above-noted proportions in an evacuated chamber at approximately the melting point of the resulting solution, in this case at between 1050 and 1100 degrees centigrade, for a period of about one-half hour. The mixture is then solidified by relatively slow cooling at a rate of about 50 degrees centrigrade per hour. The resulting a solidified mass includes a solid solution portion which is suitable for use as a phosphorus diffusion source for diffusion treatments totaling several hundred hours.

The vapor pressure of the diffusant may be altered by changing the percentage of the silicon present in the solution. For example, germanium phosphide (GeP) has a unity atmosphoric vapor pressure temperature of 580 degrees centigrade whereas for silicon phosphide (SiP) the one atmosphere value of phosphorus pressure is reached at 1140 degrees centigrade. By forming a ternary of silicon, germanium and phosphorus, the vapor pressure may be varied accurately between these two limits. Accordingly, a solid solution, described by the expression $Ge_xSi_{1-x}D$, where D is the diffusant impurity, has been disclosed for controlled solid state diffusion. Moreover a source is provided of unquestioned high purity as well as one which enables close control of the vapor pressure of the diffusant with relatively slow depletion of the diffusant. These features all enable the fabrication of thin high concentration conductivity type zones.

A diffusion source providing an N type impurity similarly may be provided using arsenic in place of phosphorus. Similar advantages will be exhibited by a ternary solid solution of the form $Ge_xSi_{1-x}As$.

Although the invention has been disclosed in terms of a single embodiment, it will be understood that other arrangements may be devised by those skilled in the art which likewise fall within the scope and spirit of the invention.

What is claimed is:

1. The method of inducing phosphorus as a significant impurity into a silicon semiconductor body to alter the conductivity thereof comprising heating a source material consisting of a ternary solid solution comprising by weight 58% germanium, 6% silicon and 36% phosphorus, and exposing the semiconductor body to the vapor from the heated source material at an elevated diffusion temperature.

References Cited

UNITED STATES PATENTS

| | | | |
|---|---|---|---|
| 2,868,678 | 1/1959 | Shockley | 148—189 XR |
| 2,997,410 | 8/1961 | Selikson | 75—134 X |
| 3,118,094 | 1/1964 | Cornelison | 148—189 X |
| 3,154,446 | 10/1964 | Jones | 148—189 |
| 3,279,954 | 10/1966 | Cody | 75—134 X |

L. DEWAYNE RUTLEDGE, Primary Examiner

R. A. LESTER, Assistant Examiner

U.S. Cl. X.R.

75—134; 148—186, 190